United States Patent
Sehmbey et al.

(10) Patent No.: US 6,234,242 B1
(45) Date of Patent: May 22, 2001

(54) TWO-PHASE THERMOSYPHON INCLUDING A POROUS STRUCTURAL MATERIAL HAVING SLOTS DISPOSED THEREIN

(75) Inventors: Maninder Singh Sehmbey, Wheeling; Morris B. Bowers, Grayslake, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/302,574

(22) Filed: Apr. 30, 1999

(51) Int. Cl.[7] ........................................................ F24H 9/02
(52) U.S. Cl. ............... 165/129; 165/104.33; 165/104.26; 165/911; 361/700; 257/715
(58) Field of Search ............................. 165/80.3, 104.26, 165/104.33, 128, 129, 911, 10; 361/700; 257/715

(56) References Cited

U.S. PATENT DOCUMENTS

| | | | |
|---|---|---|---|
| 3,746,081 | * 7/1973 | Cotman et al. | 165/104.26 |
| 4,095,647 | * 6/1978 | Asselman et al. | 165/104.26 |
| 5,529,115 | * 6/1996 | Paterson | 165/104.33 |
| 6,062,302 | * 5/2000 | Davis et al. | 165/104.26 |

FOREIGN PATENT DOCUMENTS

| | | | |
|---|---|---|---|
| 1266244 | * 5/1961 | (FR) | 165/104.33 |
| 1402509 | * 8/1975 | (GB) | 165/104.26 |
| 0001359 | * 1/1978 | (JP) | 165/104.26 |
| 0000492 | * 1/1982 | (JP) | 165/104.26 |
| 0026492 | * 2/1987 | (JP) | 165/104.26 |
| 404225791 | * 8/1992 | (JP) | 165/114.33 |
| 1016662 | * 5/1983 | (SU) | 165/104.26 |

* cited by examiner

Primary Examiner—Christopher Atkinson
(74) Attorney, Agent, or Firm—John B. MacIntyre; Douglas D. Fekete; Lalita P. Williams

(57) ABSTRACT

The present invention provides a two-phase thermosyphon (100) that includes a sealed housing (105). The housing (105) includes a first outer surface, a second outer surface opposite the first outer surface, a first inner surface, and a second inner surface. The housing (105) is preferably formed of a first housing piece and a second housing piece that are attached in such a way as to form a sealed housing. A porous structural material (101) is disposed within the housing (105). A plurality of slots (103) are disposed within the porous structural material (101). The slots (103) preferably run substantially perpendicular to the general direction of vapor flow through the porous structural material (101) and provide increased heat dissipation in the two-phase thermosyphon (100).

15 Claims, 1 Drawing Sheet

TWO-PHASE THERMOSYPHON INCLUDING A POROUS STRUCTURAL MATERIAL HAVING SLOTS DISPOSED THEREIN

FIELD OF THE INVENTION

The invention relates generally to cooling for electronic devices, and more particularly to a two-phase thermosyphon and a method for forming a two-phase thermosyphon.

BACKGROUND OF THE INVENTION

Electronic devices such as power amplifiers, power supplies, multi-chip modules, electronic hybrid assemblies such as power amplifiers, microprocessors and passive components such as filters may contain heat sources which require cooling during normal operation. Various techniques may be used for cooling electronic devices. Traditionally, electronic devices have been cooled by natural or forced air convection which involves moving air past conduction heat sinks attached directly or indirectly to the devices.

Efforts to reduce the size of devices have focused upon increased integration of electronic components. Sophisticated thermal management techniques using liquids, which allow further abatement of device sizes, have often been employed to dissipate the heat generated by integrated electronics.

Two-phase thermosyphons have been developed to provide cooling for electronic devices. Two-phase thermosyphons typically include a two-phase material within a housing. The two-phase material, typically a liquid, vaporizes when sufficient heat density is applied to the liquid in the evaporator section. The vapor generated in the evaporator section moves away from the liquid towards the condenser. In the condenser section, the vapor transforms back to liquid by rejecting heat to the ambient. The heat can be dissipated to the ambient atmosphere by a variety of means, such as natural convection, forced convection, liquid, and other suitable means.

A light structurally robust design for a compact two-phase thermosyphon includes a sealed thin-shell housing with a lanced offset fin core. This design incorporates an integrated evaporator and condenser. However, vapor transport through the lanced offset fin core is typically anisotropic, thereby restrictive in one direction, inhibiting efficient vapor transport within the condenser. This results in significant inefficiency in the thermal performance of the thermosyphon.

There is therefore a need for a light compact two-phase thermosyphon that is structurally robust and thermally efficient.

DETAILED DESCRIPTION OF A PREFERRED EMBODIMENT

The present invention provides a two-phase thermosyphon that includes a sealed housing. The housing includes a first outer surface, a second outer surface opposite the first outer surface, a first inner surface, and a second inner surface. The housing is preferably formed of a first housing piece and a second housing piece that are attached in such a way as to form a sealed housing. A porous structural material is disposed within the housing. A plurality of slots are disposed within the porous structural material. The slots preferably run substantially perpendicular to the general direction of vapor flow through the porous structural material and provide increased heat dissipation through the spreading of the heat in the form of vapor horizontally so that it is not concentrated in the area directly above the heat-generating component.

Figure 1:
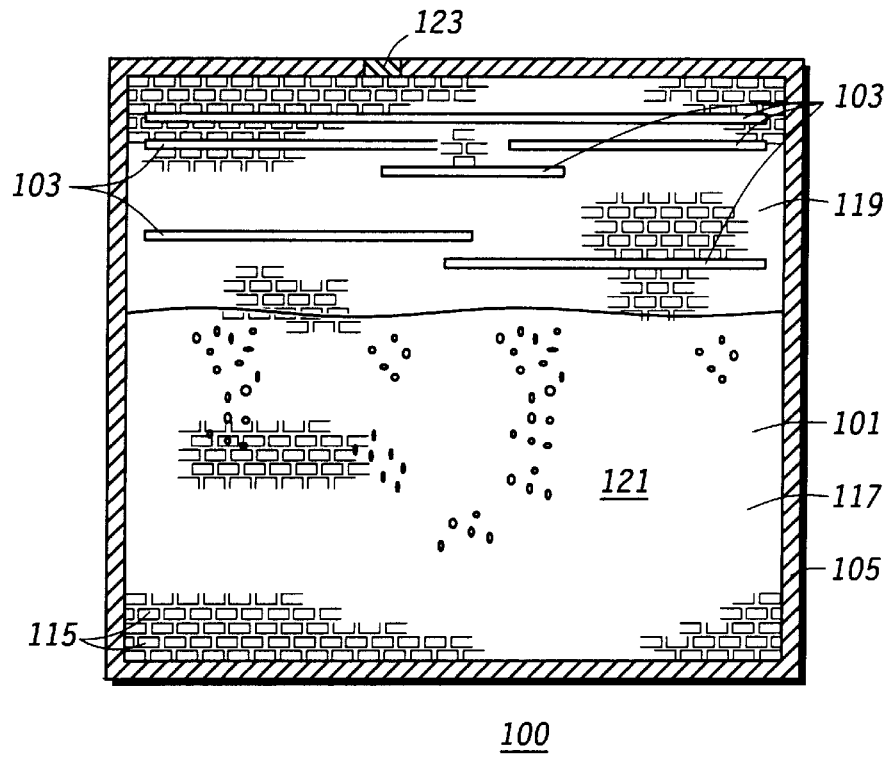
FIG. 1 depicts a two-phase thermosyphon including a porous structural material having slots disposed therein in accordance with a preferred embodiment of the present invention.
Figure 2:
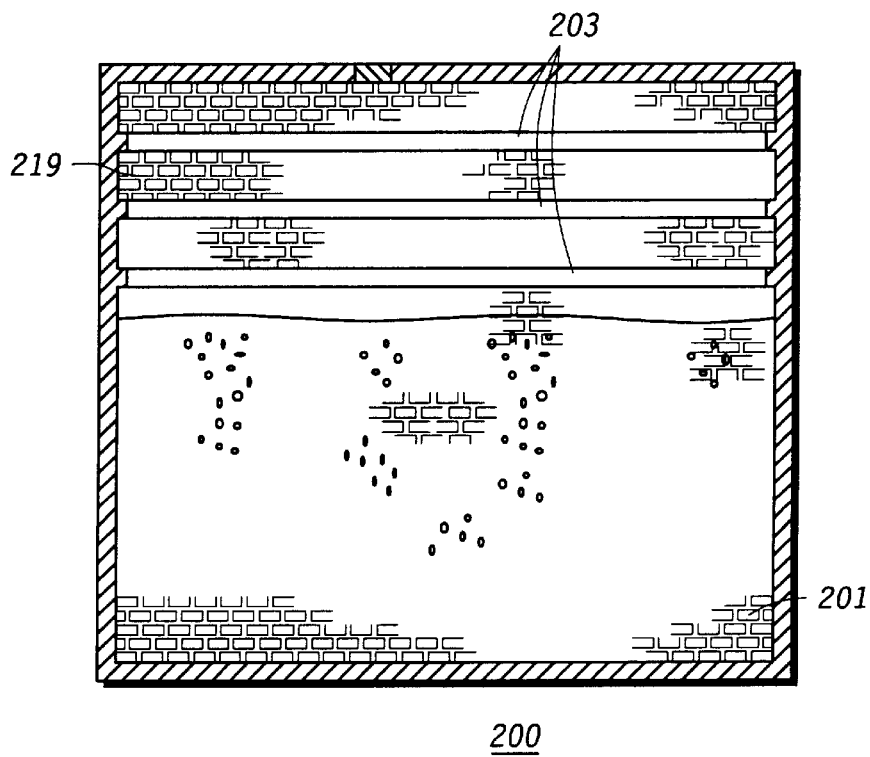
FIG. 2 depicts a two-phase thermosyphon including a porous structural material having slots disposed therein in accordance with an alternate embodiment of the present invention.

The present invention can be better understood with reference to FIGS. 1 and 2. FIG. 1 depicts a two-phase thermosyphon 100 including a porous structural material 101 having slots 103 disposed therein in accordance with a preferred embodiment of the present invention. Two-phase thermosyphon 100 comprises a sealed housing 105 that includes a first outer surface, a second outer surface opposite first outer surface, a first inner surface, and a second inner surface.

Two-phase thermosyphon 100 also includes a porous structural material 101 disposed within housing 105 and a plurality of slots 103 disposed within porous structural material 101. The plurality of slots 103 preferably run substantially perpendicular to the general direction of vapor flow through porous structural material 101.

In the preferred embodiment, housing 105 includes an evaporator portion 117 and a condenser portion 119. The plurality of slots 103 are preferably disposed within condenser portion 119.

The present invention also preferably provides a two-phase material 121 disposed within housing 105, preferably within evaporator portion 117. Housing 105 is preferably formed of aluminum or an aluminum alloy, but can alternately be formed of any material that can be attached to form a sealed housing. Such materials include, but are not limited to, a magnesium alloy, a zinc alloy, copper or a copper alloy, or stainless steel.

Porous structural material 101 preferably includes a plurality of lanced offset fins 115. Porous structural material 101 is alternately formed of a metal foam.

Two-phase thermosyphon 100 is preferably formed utilizing the following method. A first housing piece and a second housing piece are formed. The first and second housing pieces are preferably formed from separate pieces of sheet metal, preferably aluminum. A brazable alloy is then deposited on the housing pieces at each of the interfaces in the housing pieces. The brazable alloy is preferably an aluminum alloy that includes magnesium and has a lower melting temperature than the aluminum that the housing pieces are formed of.

The housing pieces are then placed together such that the brazable alloy on each of the pieces mates. Pressure is then applied, and the housing pieces are placed into a vacuum brazed furnace and heated to a temperature greater than the melting point of the brazable alloy but less than the melting temperature of the metal of which the housing pieces are formed. The first and second housing pieces are thereby joined in such a manner that the interface joining them provides a seal that is near-hermetic. As used herein, the term near-hermetic refers to a seal that is an order of magnitude less than a hermetic seal, preferably about $1 \times 10^{-7}$ standard atmospheres cc/second air equivalent leak rate.

A porous structural material 101 is formed, preferably of an aluminum alloy. Such a porous structural material is available from Robinson Fin Machines, Inc., of Kenton, Ohio. Porous structural material 101 is preferably placed between the first housing piece and the second housing piece prior to attaching them.

First housing piece can be attached to second housing piece by any suitable method that reliably attaches the pieces and forms a near-hermetic seal. In the preferred embodiment of the present invention, first housing piece is attached to second housing piece by brazing first housing piece to second housing piece, as described above. In an alternate embodiment, first housing piece is attached to second housing piece by laser welding, TIG welding, ultrasonic welding, or soldering the first housing piece to the second housing piece. In a further alternate embodiment, first housing piece is attached to the second housing piece by adhesively bonding the first housing piece to the second housing piece.

Two-phase material 121 is preferably dispensed into housing 105 after attaching the first housing piece to the second housing piece. Two-phase material 121 is preferably dispensed into substantially sealed housing 105 via a fill tube 123. After filling with two-phase material 121, fill tube 123 is closed and sealed, by welding or the like, to form a near-hermetically sealed housing.

Two-phase material 121 is a dielectric liquid, preferably a perfluorinated carbon liquid. The preferred two-phase material 121 is sold under the tradename "FLUORINERT" by 3M, Inc. Alternately, two-phase material 121 can be water, alcohol, or any suitable liquid that is capable of transitioning between two phases within the operating parameters of two-phase thermosyphon 100.

The present invention works in the following manner. Two-phase thermosyphon 100 is operably coupled to one or more heat-generating components, such as power amplifiers, power supplies, multi-chip modules, electronic hybrid assemblies such as power amplifiers, microprocessors and passive components such as filters may contain heat sources which require cooling during normal operation. The two-phase thermosyphon 100 is preferably aligned in a vertical orientation, such that two-phase material 121 is located in evaporator portion 117 of two-phase thermosyphon 100.

Two-phase thermosyphon 100 includes a plurality of slots 103 disposed within porous structural material 101 within two-phase thermosyphon 100. Slots 103 are preferably aligned generally perpendicular to the direction of vapor flow, which is in a vertical direction as depicted in FIG. 1. In this manner, slots are effective to distribute vapor across condenser portion 119 to more effectively distribute heat throughout two-phase thermosyphon 100.

FIG. 2 depicts a two-phase thermosyphon 200 including a porous structural material 201 having a plurality of slots 203 disposed therein in accordance with an alternate embodiment of the present invention. Two-phase thermosyphon 200 is substantially similar to two-phase thermosyphon 100, but includes a plurality of slots 203 that extend completely across condenser portion 219 of two-phase thermosyphon 200. Slots 203 provide good heat dissipation, particularly when the placement of heat-generating components on the outside of two-phase thermosyphon 200 is not know at the time of forming two-phase thermosyphon 200.

The present invention therefore provides a two-phase thermosyphon and a method for forming a two-phase thermosyphon. The two-phase thermosyphon includes a porous structural material disposed within the two-phase thermosyphon and a plurality of slots disposed within the porous structural material. The slots are preferably disposed in a direction that runs substantially perpendicular to the direction of vapor flow, which in the preferred embodiment is vertical.

A two-phase material is preferably disposed within the housing. This material vaporizes when reaching its boiling point, and the vapor rises to the condenser portion of the two-phase thermosyphon. The vapor condenses to provide heat dissipation for the two-phase thermosyphon. The slots disposed in the condenser portion assist in dispersing the vapor in a direction substantially perpendicular to the direction of vapor flow. In this manner, the vapor is distributed throughout the condenser portion, thereby increasing the amount of surface area to which the vapor is exposed, and thereby increasing the amount of heat dissipation provided by the two-phase thermosyphon. Additionally, this distribution of vapor provides for a more even distribution of heat in the two-phase thermosyphon, thereby spreading the heat horizontally so that it is not concentrated in the area directly above the heat-generating component.

While this invention has been described in terms of certain examples thereof, it is not intended that it be limited to the above description, but rather only to the extent set forth in the claims that follow.

We claim:

1. A two-phase thermosyphon comprising:
   a sealed planar housing including a first outer surface, a second outer surface opposite the first outer surface, a first inner surface, and a second inner surface;
   a porous structural material disposed within the housing, wherein the material completely fills a space between the first and second inner surfaces; and
   a plurality of slots disposed within the porous structural material, the plurality of slots having a height and a width that is longer than the height, the plurality of slots oriented such that the plurality of slots reduce the flow resistance along the width of the slot.

2. A two-phase thermosyphon in accordance with claim 1, wherein the plurality of slots run substantially perpendicular to the general direction of vapor flow through the porous structural material.

3. A two-phase thermosyphon in accordance with claim 1, wherein the housing includes an evaporator portion and a condenser portion, and wherein the plurality of slots are disposed within the condenser portion.

4. A two-phase thermosyphon in accordance with claim 3, further comprising a two-phase material disposed within the housing.

5. A two-phase thermosyphon in accordance with claim 1, wherein the housing is formed of aluminum or an aluminum alloy.

6. A two-phase thermosyphon in accordance with claim 1, wherein the housing is formed of a magnesium alloy.

7. A two-phase thermosyphon in accordance with claim 1, wherein the housing is formed of a zinc alloy.

8. A two-phase thermosyphon in accordance with claim 1, wherein the housing is formed of copper or a copper alloy.

9. A two-phase thermosyphon in accordance with claim 1, wherein the housing is formed of stainless steel.

10. A two-phase thermosyphon in accordance with claim 1, wherein the porous structural material has anisotropic flow properties.

11. A two-phase thermosyphon in accordance with claim 1, wherein the porous structural material includes a plurality of lanced offset fins.

12. A two-phase thermosyphon in accordance with claim 1, wherein the porous structural material comprises a metal foam.

13. A two-phase thermosyphon in accordance with claim 1, wherein the porous structural material comprises an extruded porous structural material.

14. A two-phase thermosyphon in accordance with claim 1, wherein the porous structural material comprises a cast porous structural material.

15. A two-phase thermosyphon in accordance with claim 1, wherein the porous structural material comprises a molded porous structural material.

\* \* \* \* \*